(12) United States Patent
Lu et al.

(10) Patent No.: US 10,264,700 B1
(45) Date of Patent: Apr. 16, 2019

(54) ELECTRONIC DEVICE AND POSITIONING STRUCTURE CAPABLE OF POSITIONING CASING

(71) Applicant: Wistron Corporation, New Taipei (TW)

(72) Inventors: You-Hsiung Lu, New Taipei (TW); Shuen-Chuan Chiang, New Taipei (TW)

(73) Assignee: Wistron Corporation, New Taipei (TW)

(*) Notice: Subject to any disclaimer, the term of this patent is extended or adjusted under 35 U.S.C. 154(b) by 0 days.

(21) Appl. No.: 16/000,890

(22) Filed: Jun. 6, 2018

(30) Foreign Application Priority Data

Mar. 2, 2018 (TW) ............................. 107107007 A

(51) Int. Cl.
*H05K 7/14* (2006.01)
*H02B 1/36* (2006.01)

(52) U.S. Cl.
CPC ............ *H05K 7/1489* (2013.01); *H02B 1/36* (2013.01); *H05K 7/1487* (2013.01); *H05K 7/1492* (2013.01)

(58) Field of Classification Search
CPC .. H05K 7/1487; H05K 7/1489; H05K 7/1492; H02B 1/36
See application file for complete search history.

(56) References Cited

U.S. PATENT DOCUMENTS

| 3,133,768 | A | * | 5/1964 | Klakovich | ............ | H05K 7/1421 |
| | | | | | | 312/323 |
| 6,601,933 | B1 | * | 8/2003 | Greenwald | .......... | H05K 7/1489 |
| | | | | | | 312/330.1 |
| 6,643,139 | B2 | * | 11/2003 | Tien | ...................... | G06F 1/1616 |
| | | | | | | 292/148 |
| 6,666,340 | B2 | * | 12/2003 | Basinger | .............. | H05K 7/1489 |
| | | | | | | 211/175 |
| 6,914,778 | B2 | * | 7/2005 | Deckers | .................. | G06F 1/184 |
| | | | | | | 248/201 |
| 9,430,005 | B2 | | 8/2016 | Zhu | | |
| 2005/0190535 | A1 | * | 9/2005 | Peng | ...................... | G06F 1/184 |
| | | | | | | 361/679.32 |
| 2007/0279858 | A1 | * | 12/2007 | Grady | ..................... | G06F 1/183 |
| | | | | | | 361/641 |
| 2016/0205803 | A1 | | 7/2016 | Zhu | | |

FOREIGN PATENT DOCUMENTS

TW 200951318 12/2009
TW 201626876 7/2016

* cited by examiner

*Primary Examiner* — Adrian S Wilson

(74) *Attorney, Agent, or Firm* — JCIPRNET

(57) ABSTRACT

An electronic device and a positioning structure capable of positioning a casing are provided. The electronic device includes a box, a casing and a positioning structure. The box has a slide rail and a first positioning portion therein. The casing is slidably disposed on the slide rail. The positioning structure includes a positioning element and a pressing element. One end of the positioning element and one end of the pressing element are connected to the casing. Another end of the positioning element is connected to another end of the pressing element. When the casing slides along the slide rail such that the positioning element is aligned to the first positioning portion, the positioning element is positioned to the first positioning portion, and the pressing element is adapted to be pressed such that the positioning element is separated from the first positioning portion.

20 Claims, 7 Drawing Sheets

ELECTRONIC DEVICE AND POSITIONING STRUCTURE CAPABLE OF POSITIONING CASING

CROSS-REFERENCE TO RELATED APPLICATION

This application claims the priority benefit of Taiwan application serial no. 107107007, filed on Mar. 2, 2018. The entirety of the above-mentioned patent application is hereby incorporated by reference herein and made a part of this specification.

BACKGROUND OF THE INVENTION

1. Field of the Invention

The invention relates to an electronic device and a positioning structure, and particularly relates to an electronic device and a positioning structure capable of positioning a casing.

2. Description of Related Art

A server is the core which serves all the computers and portable electronic devices in a network system and has the functions of providing network users with discs, printing service, and so forth. Also, the server allows the users to share the resources in the network with each other. In general, a server requires regular maintenance to ensure normal operation of the server. During maintenance or disassembling of the server, a server unit needs to be pulled out from a rack. However, if the size of the server unit is unknown, the server unit may be completely detached from the rack and dropped when being pulled out, and relevant personnel or the server unit may be harmed or damaged.

SUMMARY OF THE INVENTION

One or several exemplary embodiments of the invention provide an electronic device and a positioning structure capable of positioning a casing. With the electronic device and the positioning structure, relevant personnel and equipment may be prevented from being harmed or damaged during an operation.

An electronic device capable of positioning a casing according to an embodiment of the invention includes a box, a casing and a positioning structure. The box has a slide rail and a first positioning portion therein. The casing is slidably disposed on the slide rail. The positioning structure includes a positioning element and a pressing element. One end of the positioning element and one end of the pressing element are connected to the casing. Another end of the positioning element is connected to another end of the pressing element. When the casing slides along the slide rail such that the positioning element is aligned to the first positioning portion, the positioning element is positioned to the first positioning portion, and the pressing element is adapted to be pressed such that the positioning element is separated from the first positioning portion.

A positioning structure according to an embodiment of the invention includes a positioning element and a pressing element. An end of the positioning element is connected to the casing, an end of the pressing element is connected to the casing, and another end of the positioning element is connected to another end of the pressing element. When the casing slides along the slide rail such that the positioning element is aligned to the first positioning portion, the positioning element is positioned to the first positioning portion, and the pressing element is adapted to be pressed such that the positioning element is separated from the first positioning portion.

According to an embodiment of the invention, the positioning element is a spring plate. When the positioning element is not aligned to the first positioning portion, the box resists an elastic force of the positioning element and presses the positioning element toward the casing.

According to an embodiment of the invention, the positioning element has an engaging hook, the first positioning portion has an opening, and the engaging hook is adapted to be engaged into the opening to position the positioning element to the first positioning portion.

According to an embodiment of the invention, the positioning element includes a main body and an elastic element. The elastic element is connected between the engaging hook and the main body. When the positioning element is not aligned to the first positioning portion, the box resists an elastic force of the elastic element and presses the engaging hook toward the casing.

According to an embodiment of the invention, the pressing element has a pressing portion, the pressing portion is adapted to be pressed, and a distance between the pressing portion and the another end of the pressing element is greater than a distance between the engaging hook and the another end of the positioning element.

According to an embodiment of the invention, when the casing slides along the slide rail to be partially moved out of the box, the positioning element is aligned to the first positioning portion.

According to an embodiment of the invention, the box has a second positioning portion, and when the casing is located inside the box such that the positioning element is aligned to the second positioning portion, the positioning element is positioned to the second positioning portion.

According to an embodiment of the invention, the another end of the positioning element has an aperture, and the another end of the pressing element has a clasping hook. The clasping hook is adapted to pass through the aperture such that the another end of the positioning element is connected to the another end of the pressing element.

According to an embodiment of the invention, the another end of the positioning element has an aperture, and the another end of the pressing element has a bump. The bump is adapted to pass through the aperture such that the another end of the positioning element is connected to the another end of the pressing element.

According to an embodiment of the invention, the another end of the pressing element is located between the another end of the positioning element and the casing. The another end of the positioning element has an aperture. The casing has a protruding column. An end of the protruding column has a blocking portion. The protruding column is adapted to pass through the aperture, and the blocking portion is adapted to limit a range of movement of the another end of the positioning element.

Based on the above, the electronic device according to the embodiments of the invention has the positioning structure. When the casing is partially pulled out from the slide rail of the box, the positioning structure connected to the casing may be positioned to the first positioning portion on the slide rail to prevent the casing from being accidentally detached from the box and dropped. Accordingly, relevant personnel or the casing and components therein may be prevented from being harmed or damaged. The positioning structure with the configuration according to the embodiments of the invention is a two-piece structure having the positioning element and the pressing element and has a reduced resistance arm. Therefore, when the user presses the pressing element to detach the engaging hook from the opening and completely pull out the casing, the operation is less effort-consuming than an one-piece positioning structure.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
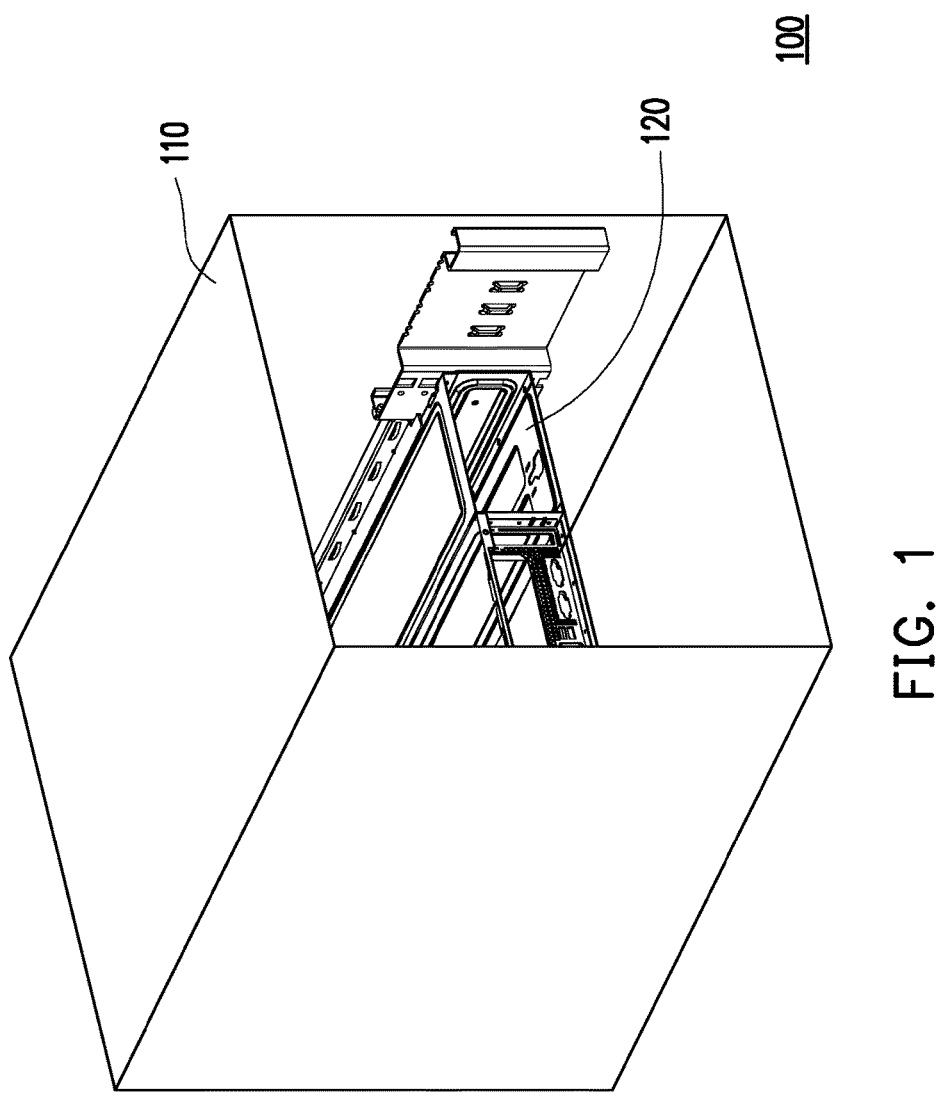
FIG. 1 is a perspective view illustrating an electronic device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
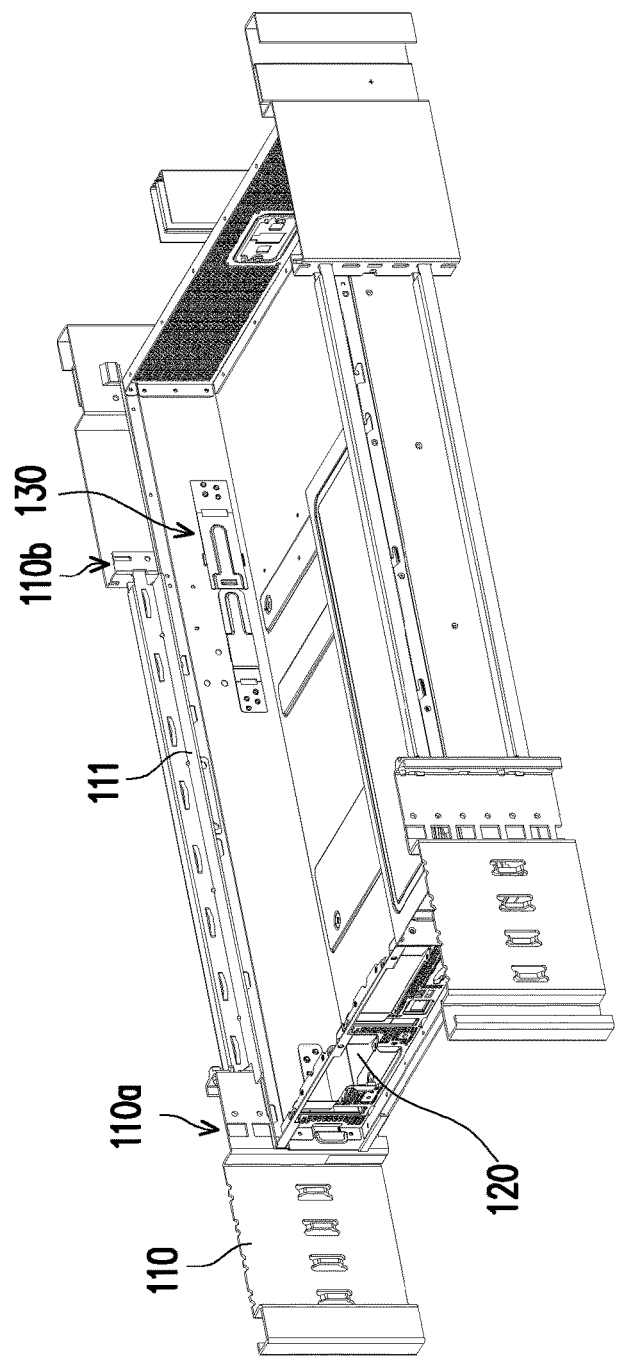
FIG. 2 is a perspective view illustrating a slide rail and a casing.
Figure 3:
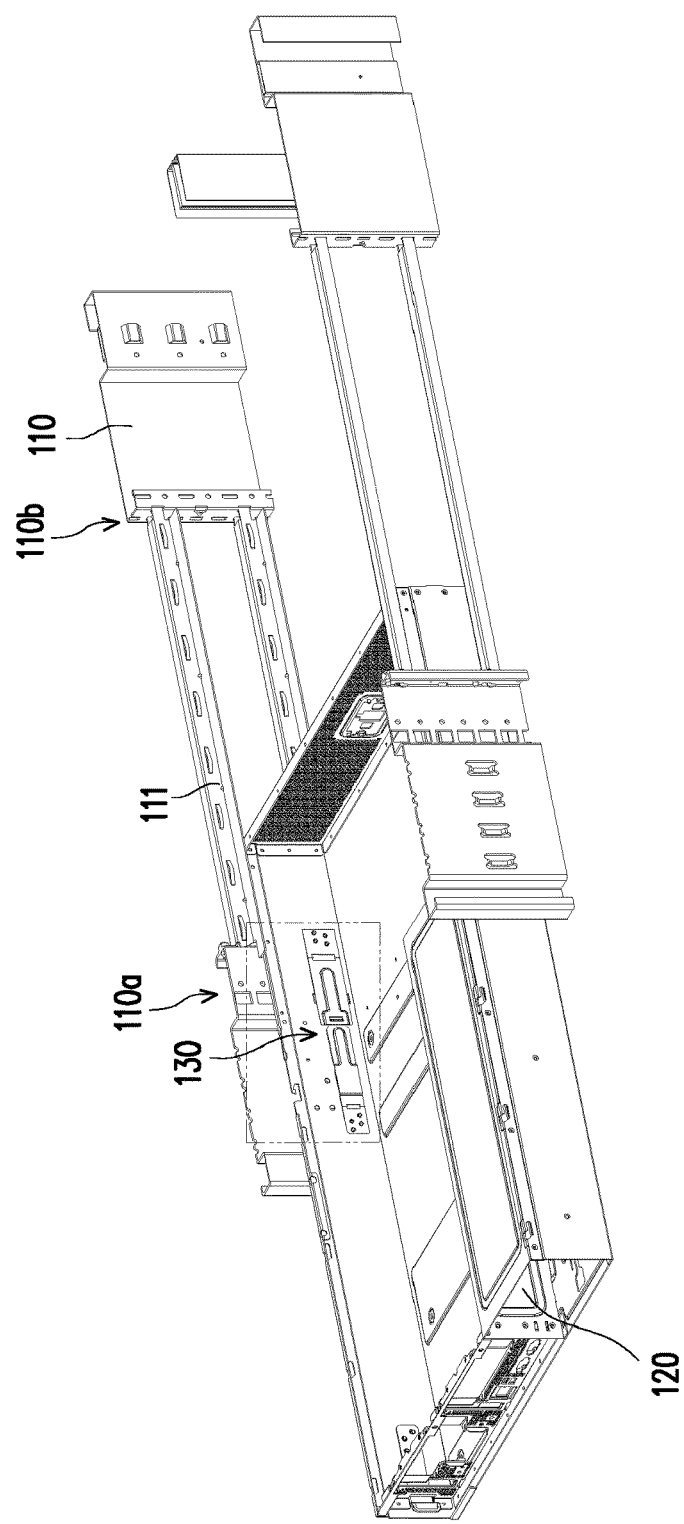
FIG. 3 is a view illustrating that the casing of FIG. 2 is pulled out.

FIG. 1 is a perspective view illustrating an electronic device according to an embodiment of the invention. FIG. 2 is a perspective view illustrating a slide rail and a casing. FIG. 3 is a view illustrating that the casing of FIG. 2 is pulled out. Referring to FIGS. 1 to 3, an electronic device 100 of the embodiment is a server, for example, and includes a box 110 and at least one casing 120. The box 110 is a rack of a server, for example, and the casing 120 is a chassis of a server unit, for example, and is disposed inside the box 110. A pair of slide rails 111 are disposed in the box 110. The casing 120 is slidably disposed on the slide rails 111. The casing 120 of FIG. 2 is in a state of being disposed in the box 110. The casing 120 may slide along the slide rails 111 and be partially moved out of the box 110, as shown in FIG. 3.

The electronic device 100 of the embodiment further includes a positioning structure 130. The positioning structure 130 is connected to the casing 120. Correspondingly, the box 110 further includes a first positioning portion 110a and a second positioning portion 110b. When the casing is disposed inside the box 110 and is in the state shown in FIG. 2, the positioning structure 130 is aligned to the second positioning portion 110b, and the positioning structure 130 and the second positioning portion 110b are positioned with respect to each other to fix the position of the casing 120. When the casing 120 is moved out of the box 110 as shown in FIG. 3, the positioning structure 130 is aligned to the first positioning portion 110a, and the positioning structure 130 and the first positioning portion 110a are positioned with respect to each other to fix the position of the casing 120. Accordingly, the casing 120 may not be excessively pulled out of the box 110 and dropped accidentally, and relevant personnel or the casing and components therein may be prevented from being harmed or damaged.

Figure 4:
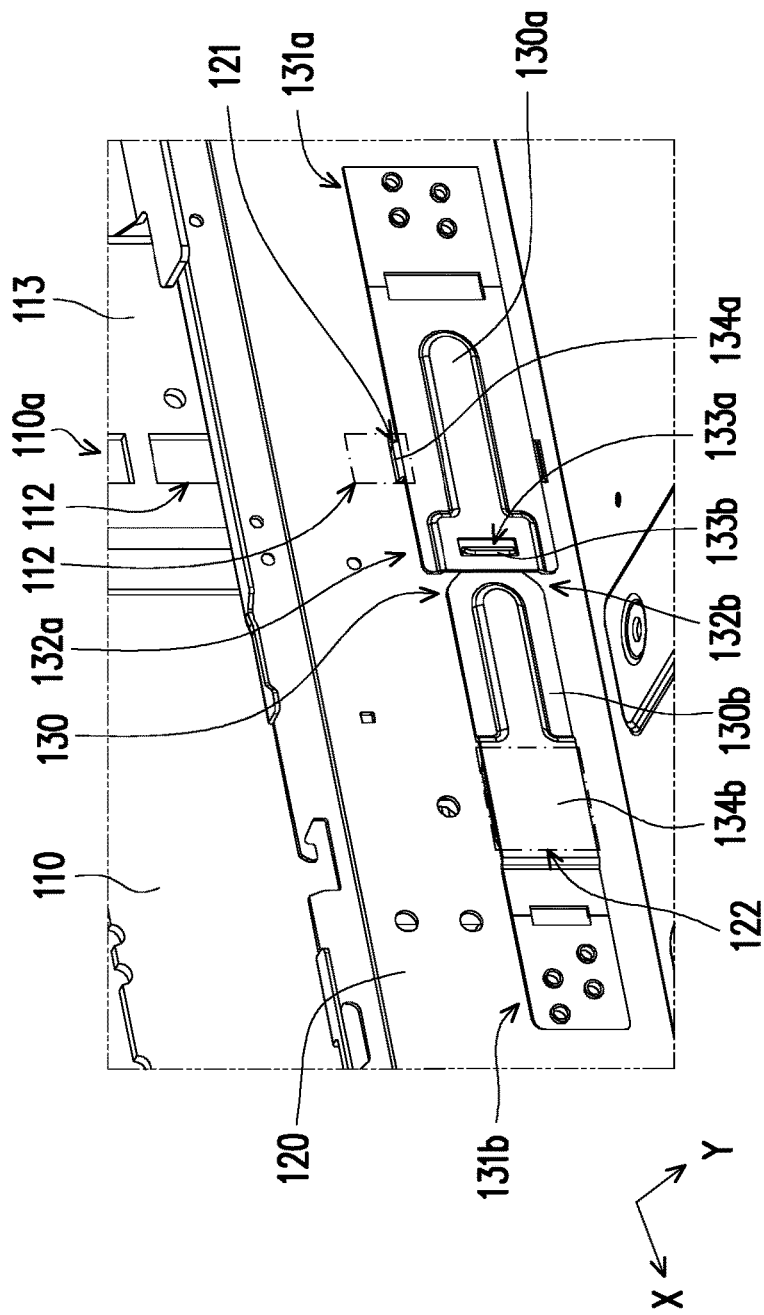
FIG. 4 is a partial perspective view illustrating the electronic device of FIG. 3.

FIG. 4 is a partial perspective view illustrating the electronic device of FIG. 3. Referring to FIG. 4, the positioning structure 130 of the embodiment includes a positioning element 130a and a pressing element 130b. An end 131a of the positioning element 130a is connected to the casing 120, an end 131b of the pressing element 130b is connected to the casing 120. An end 132a of the positioning element 130a is connected to an end 132b of the pressing element 130b. More specifically, the positioning structure 130 is positioned to the first positioning portion 110a by means of the positioning element 130a. If the casing 120 needs to be further removed from the box 110, a force may be applied to the pressing element 130b to completely remove the casing 120. The positioning element 130a further includes at least one engaging hook 134a. When the pressing element 130b is pressed, one end 132b of the pressing element 130b may drive the end 132a of the positioning element 130a to move together. Accordingly, the engaging hook 134a of the positioning element 130a is detached from the first positioning portion 110a, and the casing 120 may thereby be completely removed from the box 110.

If the positioning structure 130 is a one-piece structure as in the known art, the positioning element 130a and the pressing element 130b are not two components as shown in FIG. 4, but are formed integrally. Under such circumstance, there is no pivotal connection point between the positioning element 130a and the pressing element 130b, and the end 131a of the positioning element 130a is not connected with the casing 120. In such case, since a distance (i.e., urging arm) from the point where a force is applied (i.e., at the pressing element 130b) to the fulcrum (i.e., the end 131b of the pressing element 130b) is shorter than a distance (i.e., a resistance arm) from a resistance position (i.e., the engaging hook 134a) to the fulcrum (i.e., the end 131b of the pressing element 130b), it requires a greater pressing force to create a sufficient movement of the engaging hook 134a toward the Y direction. Therefore, such configuration is relatively laborious. However, in a two-piece structure as in the positioning structure 130 of the embodiment, the resistance arm is a distance from the resistance position (i.e., the engaging hook 134a) to the fulcrum (i.e., the end 131a of the positioning element 130a) and is shorter. Thus, when the user presses the positioning structure 130, the operation is less effort-consuming than the one-piece positioning structure.

Specifically, the positioning element 130a and the pressing element 130b may be connected to the casing 120 through riveting. However, such configuration only serves as an example and shall not be construed as a limitation on the invention. The positioning element 130a and the pressing element 130b may also be connected to the casing 120 in a different way. Besides, an aperture 133a is provided at the end 132a of the positioning element 130a, and the end 132b of the pressing element 130b has a clasping hook 133b. The clasping hook 133b is adapted to pass through the aperture 133a such that the end 132a of the positioning element 130a is connected to the end 132b of the pressing element 130b. However, such configuration only serves as an example and shall not be construed as a limitation on the invention. The positioning element 130a and the pressing element 130b may also be connected to each other in a different way.

When the casing 120 slides along the slide rail 111 (i.e., along the X direction in FIG. 4) to be partially moved out of the box 110 as shown in FIG. 3, the positioning element 130a is aligned to the first positioning portion 110a as shown in FIG. 4 and is positioned to the first positioning portion 110a. Details concerning positioning of the positioning element 130a to the first positioning portion are described in the following. At least one hole 121 is provided on the casing 120. When the positioning element 130a contacts a sidewall of the casing 120, the engaging hook 134a is adapted to penetrate through the hole 121 in a direction toward the box 110. The first positioning portion 110a has at least one opening 112. When the casing 120 slides along the slide rail 111 and the positioning element 130a is aligned to the first positioning portion 110a, the engaging hook 134a penetrates through the hole 121 and is adapted to be engaged into the opening 112 to position the positioning element 130a to the first positioning portion 110a.

Details of engaging the engaging hook 134a into the opening 112 are described in the following. In the embodiment, the positioning element 130a is a spring plate, for example. When the positioning element 130a is not aligned to the first positioning portion 110a, a wall surface 113 of the box 110 may resist an elastic force of the positioning element 130a to press the positioning element 130a toward the casing 120. Accordingly, the engaging hook 134a may not protrude out of the hole 121 of the casing 120 toward the box 110. When the casing 120 slides along the slide rail 111 and the positioning element 130a is aligned to the position of the first positioning portion 110a, the engaging hook 134a is aligned to the position of the opening 112. Since the engaging hook 134a is no longer pressed by the wall surface 113 of the box 110, the engaging hook 134a is engaged into the opening 112 through an elastic force of the positioning element 130a and position the positioning element 130a.

Figure 5:
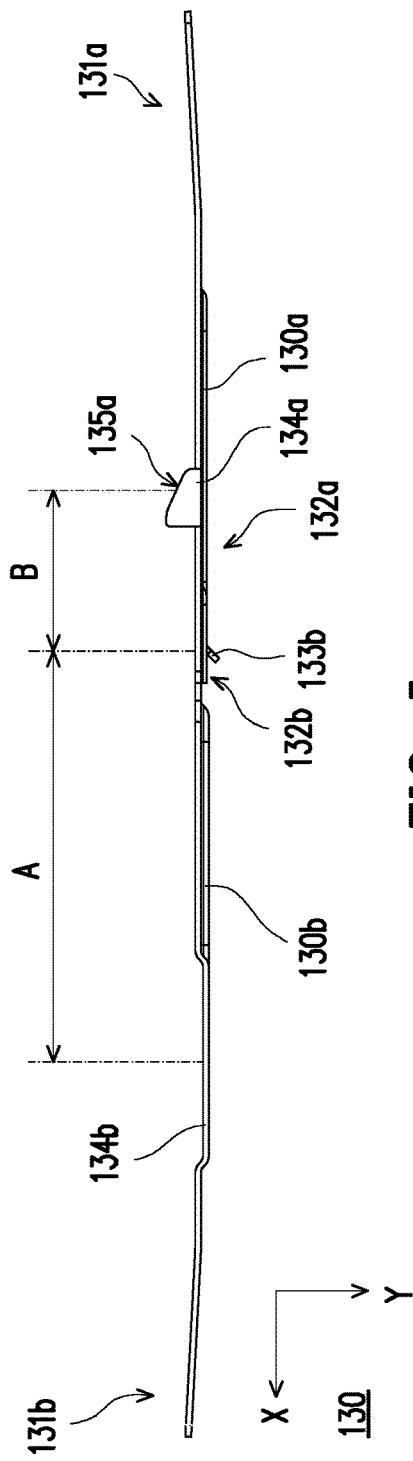
FIG. 5 is a top view illustrating the positioning structure of FIG. 4 from the top of the box.

In FIG. 4, the pressing element 130b further includes a pressing portion 134b. The pressing portion 134b is adapted to be pressed along the Y direction to separate the positioning element 130a from the first positioning portion 110a. FIG. 5 is a top view illustrating the positioning structure of FIG. 4 from the top of the box. Referring to FIGS. 4 and 5, a hole 122 is provided at a position on the casing 120 corresponding to the pressing element 130b. The pressing portion 134b of the pressing element 130b is adapted to protrude from the hole 122 and be pressed. Details of the operation are described in the following.

When the pressing portion 134b is pressed toward the inside of the casing 120, since the end 131b of the pressing element 130b is fixed to the casing 120, the pressing element 130b is subjected to a moment of force to rotate toward the Y direction in FIGS. 4 and 5 by using the end 131b of the pressing element 130b as the fulcrum. Since the clasping hook 133b of the pressing element 130b is connected to the aperture 133a of the positioning element 130a, the positioning element 130a is also subjected to a moment of force to rotate the end 131a of the positioning element 130a. Under the circumstance, the engaging hook 134a of the positioning element 130a is jointly moved toward the inside of the casing 120 and is detached from the opening 112 on the first positioning portion 110a of the box 110. Therefore, the casing 120 is able to be removed from the box 110.

Specifically, in the embodiment, a distance A between the pressing portion 134b and the end 132b of the pressing element 130b is greater than a distance B between the engaging hook 134a and the end 132a of the positioning element 130a. Given that the movement of the pressing portion 134b in the Y direction is the same, if the distance A is greater, the movement of the end 132a of the positioning element 130a in the Y direction is also greater. In addition, given that the movement of the end 131a of the positioning element 130a in the Y direction remains constant, the movement of the engaging hook 134a in the Y direction is greater if the distance B is shorter. Therefore, under the circumstance that the distance A is greater than the distance B, it only requires a small movement created by pressing the pressing portion 134b to detach the engaging hook 134a from the opening 122. Therefore, it is less effort-consuming for the user to operate. Besides, the engaging hook 134a also has an inclined guiding surface 135a. When the user intends to push the casing 120 into the box 110, the user may simply apply a force to the casing 120 in a direction opposite to the X direction in FIGS. 4 and 5, and the engaging hook 134a may thereby be detached from the opening 112 through the inclined guiding surface 135a. Accordingly, the casing 120 is pushed into the box 110.

Figure 6:
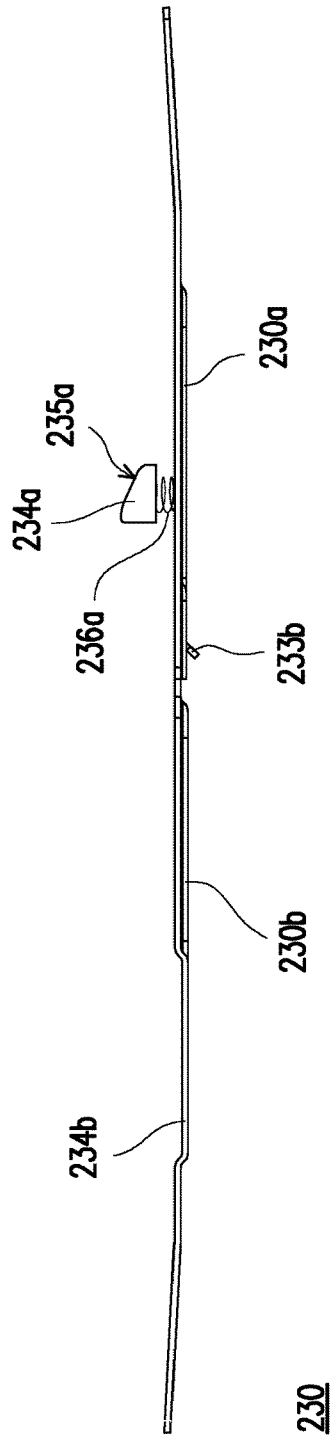
FIG. 6 is a top view illustrating a positioning structure according to another embodiment of the invention.

FIG. 6 is a top view illustrating a positioning structure according to another embodiment of the invention. In a positioning structure 230 in FIG. 6, functions and arrangements of a pressing element 230b, a clasping hook 233b, and a pressing portion 234b are similar to those of the pressing element 130b, the clasping hook 133b, and the pressing portion 134b shown in FIG. 5. Therefore, details in this regard will not be repeated in the following. A difference between the positioning structure 230 and the positioning structure 130 is that a positioning element 230a of the embodiment is not a spring plate. The positioning element 230a includes a main body 235a and an elastic element 236a. The elastic element 236a is connected between the engaging hook 234a and the main body 235a. When the positioning element 230a is not aligned to the first positioning portion 110a, the box 110 may resist an elastic force of the elastic member 236a to press the engaging hook 234a toward the casing 120. Such configuration also has the same effect as that of the positioning structure 130 in the previous embodiment.

Figure 7:
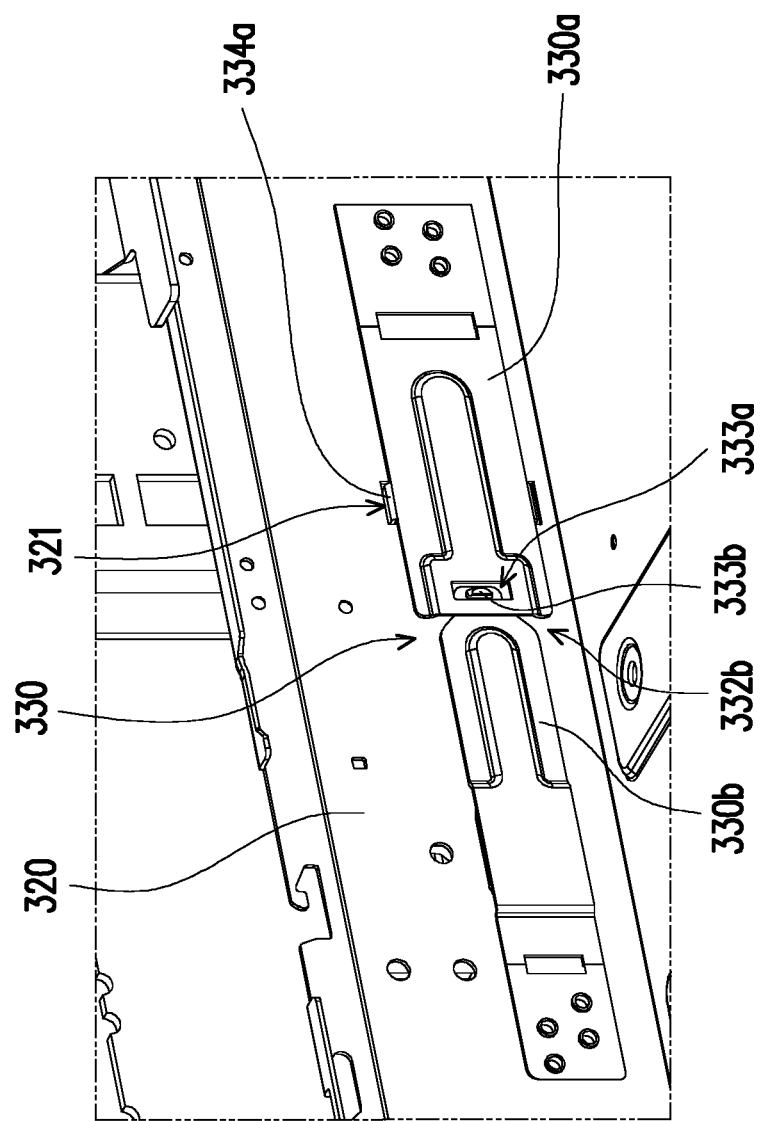
FIG. 7 is a perspective view illustrating a positioning structure according to another embodiment of the invention.

FIG. 7 is a perspective view illustrating a positioning structure according to another embodiment of the invention. In a positioning structure 330 of FIG. 7, arrangements and functions of a positioning element 330a, an engaging hook 334a, and a hole 321 of a casing 320 are similar to those of the positioning element 130a, the engaging hook 134a, and the hole 121 of the casing 120 shown in FIG. 4. Therefore, details in this regard will not be repeated in the following. Referring to FIG. 7, a difference between the positioning structure 330 and the positioning structure 130 is that an end 332b of a pressing element 330b of the embodiment has a bump 333b in replacement of the clasping hook 133b shown in FIG. 4. The bump 333b is adapted to pass through an aperture 333a of the positioning element 330a to connect the positioning element 330a to the pressing element 330b.

Figure 8:
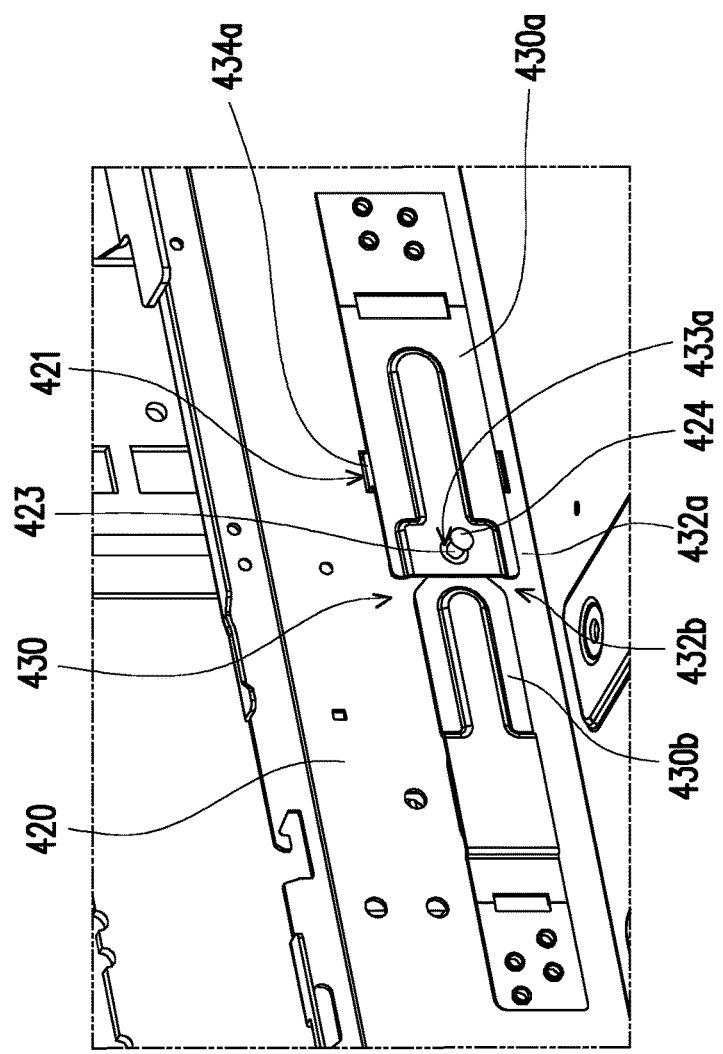
FIG. 8 is a perspective view illustrating a positioning structure according to another embodiment of the invention.

FIG. 8 is a perspective view illustrating a positioning structure according to another embodiment of the invention. In a positioning structure 430 of FIG. 8, arrangements and functions of a positioning element 430a, a pressing element 430b, an engaging hook 434a, and a hole 421 of a casing 420 are similar to those of the positioning element 130a, the pressing element 130b, the engaging hook 134a, and the hole 121 of the casing 120 shown in FIG. 4. Therefore, details in this regard will not be repeated in the following. Referring to FIG. 8, a difference between the positioning structure 430 and the positioning structure 130 is that an end 432b of a pressing element 430b is not connected to an end 432a of a positioning element 430a. The end 432b of the pressing element 430b is located between the positioning element 430a and the casing 120. A protruding column 423 is provided on the sidewall of the casing 120. The protruding column 423 is adapted to pass through an aperture 433a of the positioning element 430a. When the end 432b of the pressing element 430b is moved, the movement is adapted to press and drive the end 432a of the positioning element 430a to move the aperture 433a of the positioning element 430a along the protruding column 423. Besides, a blocking portion 424 is provided at an end of the protruding column 423 to prevent the pressing element 430b from being detached from the protruding column 432 due to excessive pressing.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electronic device capable of positioning a casing, comprising:
    a box, having a slide rail and a first positioning portion therein;
    a casing, slidably disposed on the slide rail; and
    a positioning structure, comprising a positioning element and a pressing element, wherein an end of the positioning element is connected to the casing, an end of the pressing element is connected to the casing, and another end of the positioning element is connected to another end of the pressing element, and
    when the casing slides along the slide rail such that the positioning element is aligned to the first positioning portion, the positioning element is positioned to the first positioning portion, and the pressing element is adapted to be pressed such that the positioning element is separated from the first positioning portion.

2. The electronic device capable of positioning the casing as claimed in claim 1, wherein the positioning element is a spring plate, and when the positioning element is not aligned to the first positioning portion, the box resists an elastic force of the positioning element and presses the positioning element toward the casing.

3. The electronic device capable of positioning the casing as claimed in claim 1, wherein the positioning element has an engaging hook, the first positioning portion has an opening, and the engaging hook is adapted to be engaged into the opening to position the positioning element to the first positioning portion.

4. The electronic device capable of positioning the casing as claimed in claim 3, wherein the positioning element comprises a main body and an elastic element, the elastic element is connected between the engaging hook and the main body, and when the positioning element is not aligned to the first positioning portion, the box resists an elastic force of the elastic element and presses the engaging hook toward the casing.

5. The electronic device capable of positioning the casing as claimed in claim 3, wherein the pressing element has a pressing portion, the pressing portion is adapted to be pressed, and a distance between the pressing portion and the another end of the pressing element is greater than a distance between the engaging hook and the another end of the positioning element.

6. The electronic device capable of positioning the casing as claimed in claim 1, wherein when the casing slides along the slide rail to be partially moved out of the box, the positioning element is aligned to the first positioning portion.

7. The electronic device capable of positioning the casing as claimed in claim 1, wherein the box has a second positioning portion, and when the casing is located inside the box such that the positioning element is aligned to the second positioning portion, the positioning element is positioned to the second positioning portion.

8. The electronic device capable of positioning the casing as claimed in claim 1, wherein the another end of the positioning element has an aperture, the another end of the pressing element has a clasping hook, the clasping hook is adapted to pass through the aperture such that the another end of the positioning element is connected to the another end of the pressing element.

9. The electronic device capable of positioning the casing as claimed in claim 1, wherein the another end of the positioning element has an aperture, the another end of the pressing element has a bump, the bump is adapted to pass through the aperture such that the another end of the positioning element is connected to the another end of the pressing element.

10. The electronic device capable of positioning the casing as claimed in claim 1, wherein the another end of the pressing element is located between the another end of the positioning element and the casing, the another end of the positioning element has an aperture, the casing has a protruding column, an end of the protruding column has a blocking portion, the protruding column is adapted to pass through the aperture, and the blocking portion is adapted to limit a range of movement of the another end of the positioning element.

11. A positioning structure, comprising:
    a positioning element, wherein one end of the positioning element is connected to a casing; and
    a pressing element, wherein one end of the pressing element is connected to the casing, and another end of the positioning element is connected to another end of the pressing element, and
    when the casing slides along a slide rail of a box such that the positioning element is aligned to a first positioning portion of the box, the positioning element is positioned to the first positioning portion, and the pressing element is adapted to be pressed such that the positioning element is separated from the first positioning portion.

12. The positioning structure as claimed in claim 11, wherein the positioning element is a spring plate, and when the positioning element is not aligned to the first positioning portion, the box resists an elastic force of the positioning element and presses the positioning element toward the casing.

13. The positioning structure as claimed in claim 11, wherein the positioning element has an engaging hook, the first positioning portion has an opening, and the engaging hook is adapted to be engaged into the opening to position the positioning element to the first positioning portion.

14. The positioning structure as claimed in claim 13, wherein the positioning element comprises a main body and an elastic element, the elastic element is connected between the engaging hook and the main body, and when the positioning element is not aligned to the first positioning portion, the box resists an elastic force of the elastic element and presses the engaging hook toward the casing.

15. The positioning structure as claimed in claim 13, wherein the pressing element has a pressing portion, the pressing portion is adapted to be pressed, and a distance between the pressing portion and the another end of the pressing element is greater than a distance between the engaging hook and the another end of the positioning element.

16. The positioning structure as claimed in claim 11, wherein when the casing slides along the slide rail to be partially moved out of the box, the positioning element is aligned to the first positioning portion.

17. The positioning structure as claimed in claim 11, wherein the box has a second positioning portion, and when the casing is located inside the box such that the positioning element is aligned to the second positioning portion, the positioning element is positioned to the second positioning portion.

18. The positioning structure as claimed in claim 11, wherein the another end of the positioning element has an aperture, the another end of the pressing element has a clasping hook, the clasping hook is adapted to pass through the aperture such that the another end of the positioning element is connected to the another end of the pressing element.

19. The positioning structure as claimed in claim 11, wherein the another end of the positioning element has an aperture, the another end of the pressing element has a bump, the bump is adapted to pass through the aperture such that the another end of the positioning element is connected to the another end of the pressing element.

20. The positioning structure as claimed in claim 11, wherein the another end of the pressing element is located between the another end of the positioning element and the casing, the another end of the positioning element has an aperture, the casing has a protruding column, an end of the protruding column has a blocking portion, the protruding column is adapted to pass through the aperture, and the blocking portion is adapted to limit a range of movement of the another end of the positioning element.

* * * * *